United States Patent
Ker et al.

(10) Patent No.: US 9,224,702 B2
(45) Date of Patent: Dec. 29, 2015

(54) THREE-DIMENSION (3D) INTEGRATED CIRCUIT (IC) PACKAGE

(71) Applicant: AMAZING MICROELECTRONIC CORP., New Taipei (TW)

(72) Inventors: Ming-Dou Ker, Hsinchu County (TW); Che-Hao Chuang, Hsinchu County (TW)

(73) Assignee: Amazing Microelectronic Corp., New Taipei (TW)

( * ) Notice: Subject to any disclaimer, the term of this patent is extended or adjusted under 35 U.S.C. 154(b) by 214 days.

(21) Appl. No.: 14/104,251

(22) Filed: Dec. 12, 2013

(65) Prior Publication Data

US 2015/0171031 A1    Jun. 18, 2015

(51) Int. Cl.
   *H01L 21/00*   (2006.01)
   *H01L 23/60*   (2006.01)
   *H01L 23/00*   (2006.01)

(52) U.S. Cl.
   CPC ............... *H01L 23/60* (2013.01); *H01L 24/17* (2013.01); *H01L 2224/16* (2013.01)

(58) Field of Classification Search
   CPC ...... H01L 23/60; H01L 24/17; H01L 2224/16
   See application file for complete search history.

(56) References Cited

U.S. PATENT DOCUMENTS

| | | | |
|---|---|---|---|
| 7,855,420 B2 | 12/2010 | Chapman et al. | |
| 7,989,282 B2 | 8/2011 | Voldman | |
| 8,017,471 B2 | 9/2011 | Chapman et al. | |
| 8,054,597 B2 | 11/2011 | Gebreselasie et al. | |
| 8,164,113 B2 | 4/2012 | Lin et al. | |
| 8,264,065 B2 | 9/2012 | Su et al. | |
| 8,441,104 B1 | 5/2013 | Hu et al. | |
| 2011/0304010 A1 | 12/2011 | Jiang et al. | |
| 2012/0153437 A1 | 6/2012 | Chen et al. | |
| 2012/0182650 A1* | 7/2012 | Chi ........................ | H01L 23/60 361/54 |
| 2013/0082365 A1 | 4/2013 | Bernier et al. | |
| 2013/0083436 A1 | 4/2013 | Tseng et al. | |

FOREIGN PATENT DOCUMENTS

TW    201027705 A1    7/2010
TW    201036137 A1    10/2010

* cited by examiner

*Primary Examiner* — Laura Menz
(74) *Attorney, Agent, or Firm* — Rosenberg, Klein & Lee

(57) ABSTRACT

A three-dimension (3D) integrated circuit (IC) package is disclosed. The 3D IC package has a package substrate having a surface. At least one integrated circuit (IC) chip with or without suppressing a transient voltage and at least one transient voltage suppressor (TVS) chip are arranged on the surface of the substrate and electrically connected with each other. The IC chip is independent from the TVS chip. The IC chip and the TVS chip stacked on each other are arranged on the package substrate. Alternatively, the IC chip and the TVS chip are together arranged on an interposer formed on the package substrate.

3 Claims, 9 Drawing Sheets

THREE-DIMENSION (3D) INTEGRATED CIRCUIT (IC) PACKAGE

BACKGROUND OF THE INVENTION

1. Field of the Invention

The present invention relates to a package, particularly to a three-dimension (3D) integrated circuit (IC) package for system level ESD (Electrostatic Discharge) protection.

2. Description of the Related Art

Because the IC device sizes have been shrunk to nanometer scale, the consumer electronics, like the laptop and mobile devices, have been designed to be much smaller than ever. Without suitable protection devices, the functions of these electronics could be reset or even damaged under ESD (Electrostatic Discharge) events. Currently, all consumer electronics are expected to pass the ESD test requirement of IEC 61000-4-2 standard. TVS (Transient Voltage Suppressor) is generally designed to bypass the ESD energy, so that the electronic systems can be prevented from ESD damages.

The working principle of TVS is shown in FIG. 1. In FIG. 1, the TVS devices 10 are connected in parallel with the protected circuits 12 on the PCB (Printed Circuit Board). These TVS devices 10 would be triggered immediately when the ESD event is occurred. In that way, each TVS device 10 can provide a superiorly low resistance path for discharging the transient ESD current, so that the energy of the ESD transient current can be bypassed by the TVS devices 10.

FIG. 2 is a diagram showing a traditional two-dimension (2D) System-in-Package (SiP) with TVS. The SiP comprises a functional chip 14 and a TVS chip 16 installed on a die paddle 18. The functional chip 14 and the TVS chip 16 are connected with leads 20 by wire bonding. L1 and L2 are parasitic inductance of bond wire in traditional 2D package. If L1<L2, the impedance ($\omega L$) of the ESD current path through the TVS chip 16 will be larger than that of the functional chip 14. The functional chip 14 will be damaged by ESD current before TVS chip 16 turned-on during system level ESD stress. Therefore, the ESD protection design in functional chip 14 is still necessary. Besides, a TVS is integrated in an IC chip in the traditional technology. When a breakdown voltage or input parasitic capacitance of the TVS requires to be changed, the complex fabrication process for IC is also changed, which increases the fabrication cost and may degrade performance for functional chip.

To overcome the abovementioned problems, the present invention provides a three-dimension (3D) integrated circuit (IC) package, so as to solve the afore-mentioned problems of the prior art.

SUMMARY OF THE INVENTION

A primary objective of the present invention is to provide a three-dimension (3D) integrated circuit (IC) package, which installs an IC chip with or without suppressing a transient voltage and a transient voltage suppressor (TVS) chip on a package substrate through conduction plugs, so as to avoid forming bond wire inductances to degrade protection capability of the TVS chip. Besides, different process techniques can be used for the IC chip and the TVS chip, whereby the electrical characteristics of the TVS chip can be easily adjusted, and the fabrication cost can be saved.

To achieve the abovementioned objectives, the present invention provides a 3D IC package, which comprises a package substrate having a surface. At least one integrated circuit (IC) chip with or without suppressing a transient voltage and at least one transient voltage suppressor (TVS) chip are arranged on the surface of the substrate and electrically connected with each other. The IC chip is independent from the TVS chip. The IC chip and the TVS chip stacked on each other are arranged on the package substrate. Alternatively, the IC chip and the TVS chip are together arranged on an interposer formed on the package substrate.

Below, the embodiments are described in detail in cooperation with the drawings to make easily understood the technical contents, characteristics and accomplishments of the present invention.

DETAILED DESCRIPTION OF THE INVENTION

The present invention embeds system level electrostatic discharge (ESD) protection capability for an integrated circuit (IC) chip by transient voltage suppressor (TVS) chip integration in three-dimension (3D) IC package.

Figure 1:
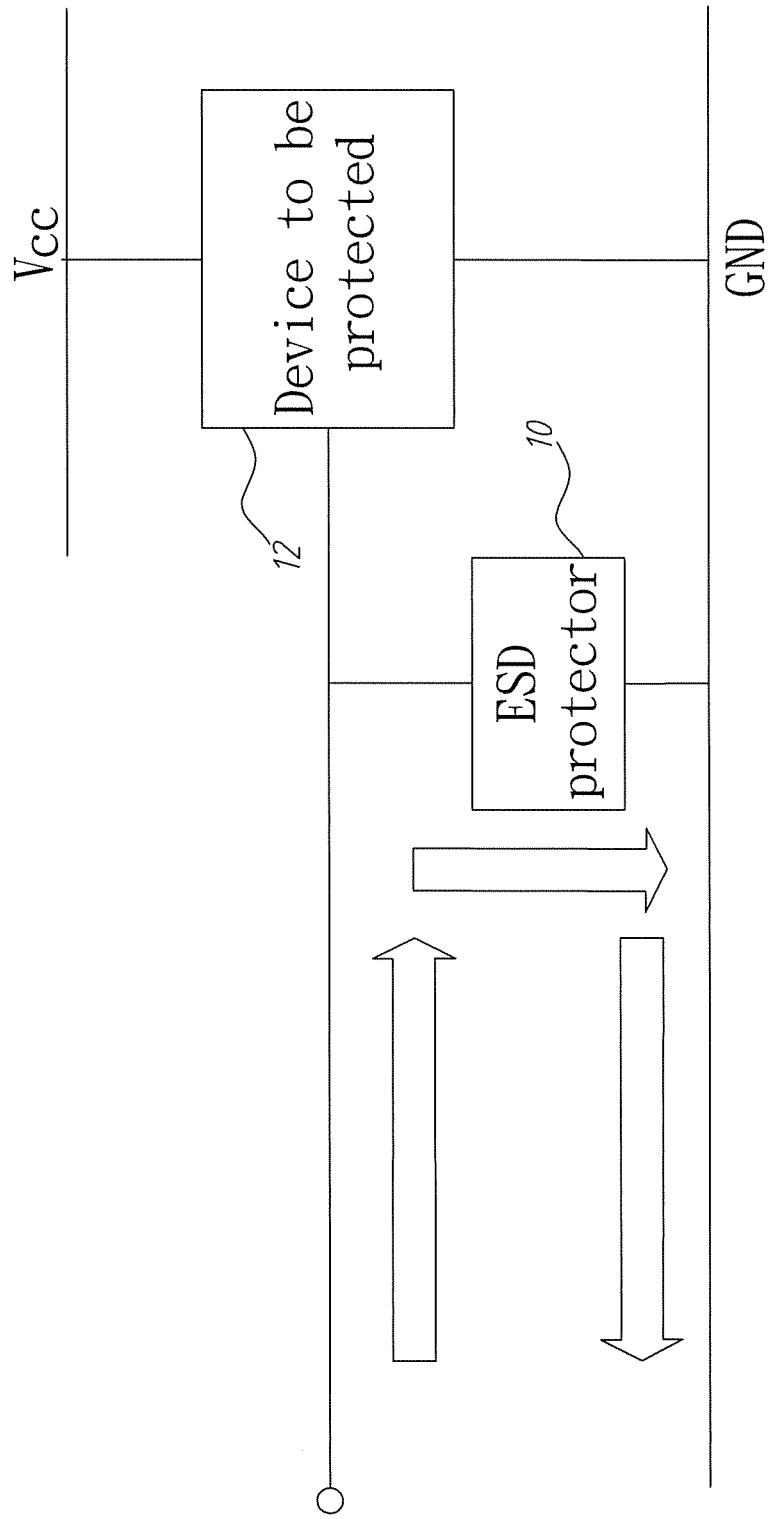
FIG. 1 is a circuit diagram showing a transient voltage suppressor connected with a protected circuit in the traditional technology.
Figure 2:
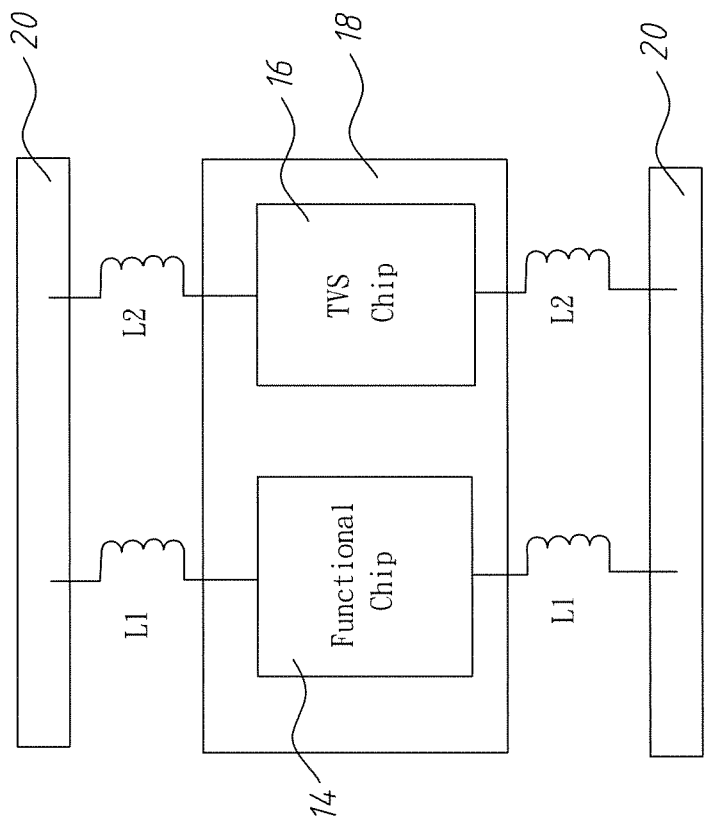
FIG. 2 is a diagram showing a two-dimension (2D) System-in-Package (SiP) with TVS in the traditional technology.
Figure 3:
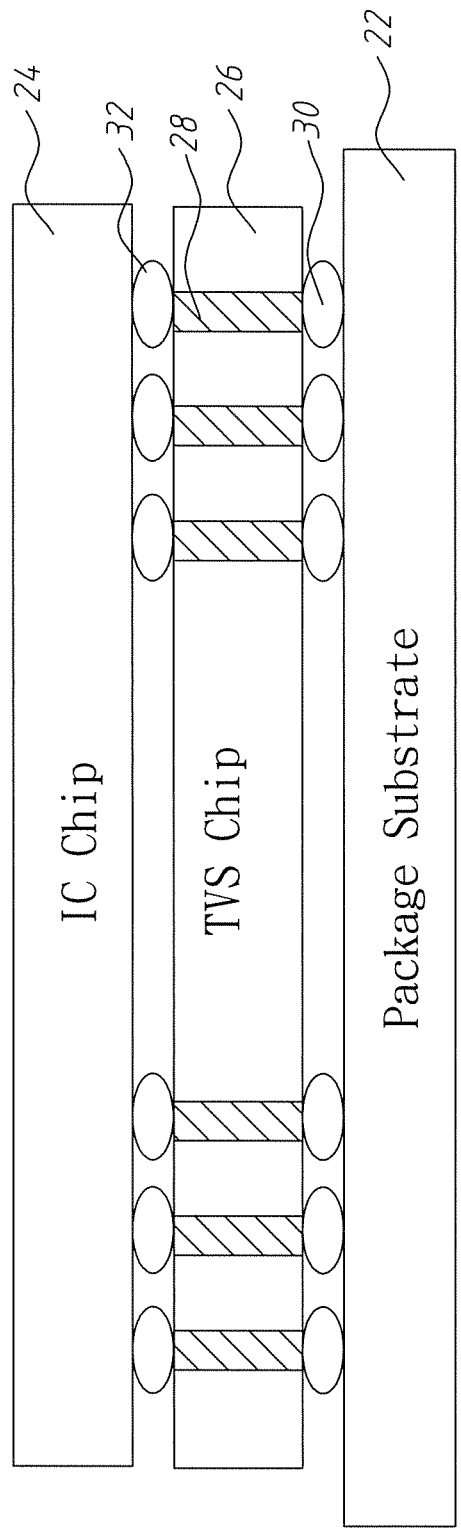
FIG. 3 is a diagram showing a three-dimension (3D) integrated circuit (IC) package according to the first embodiment of the present invention.
Figure 4:
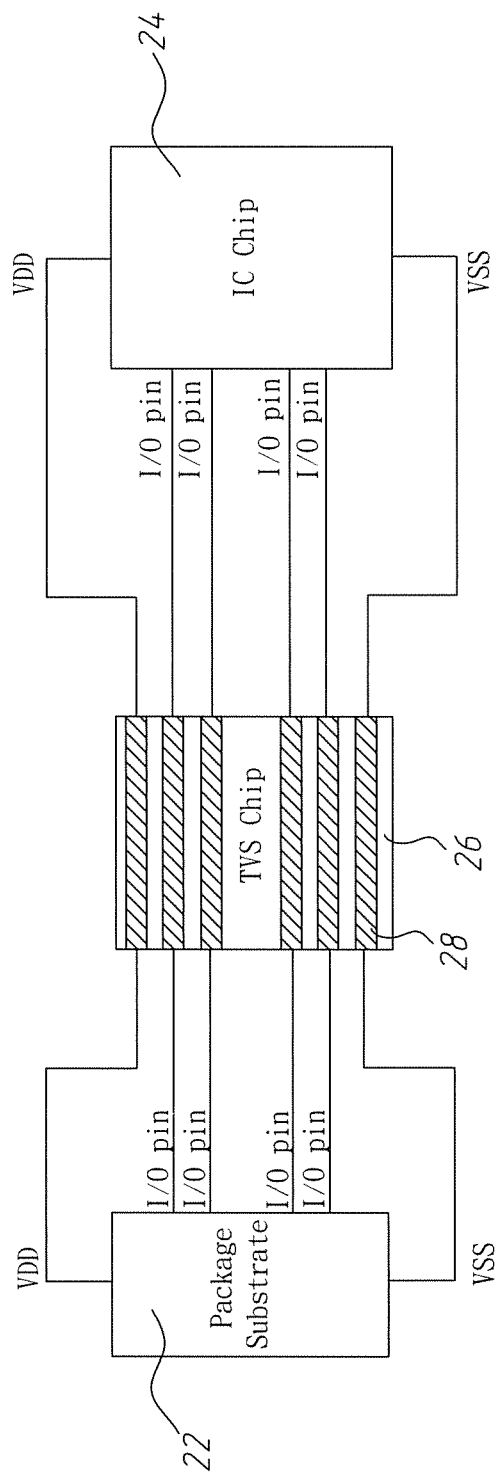
FIG. 4 is a schematic diagram showing the 3D IC package electrically connected with VDD, VSS and I/O pins according to the first embodiment of the present invention.

The first embodiment of the present invention is introduced as below. Refer to FIG. 3 and FIG. 4. The first embodiment comprises a package substrate 22 having a surface. At least one transient voltage suppressor (TVS) chip 26 and at least one integrated circuit (IC) chip 24 with or without suppressing a transient voltage are sequentially stacked on the surface and electrically connected with each other. The IC chip 24 is independent from the TVS chip 26. The TVS chip 26 only has ESD function without including a memory, an analog circuit, a digital circuit and/or a radio frequency (RF) circuit. In the first embodiment, take one IC chip 24 and one TVS chip 26 for example. A plurality of conduction plugs 28, such as through-silicon-via devices, is arranged in the TVS chip 26. A plurality of the first conduction bumps 30 is arranged on conduction areas of the surface of the package substrate 22 and respectively arranged under the conduction plugs 28, whereby the TVS chip 26 is electrically connected with the conduction areas through the first conduction bumps 30 and the conduction plugs 28. A plurality of the second conduction bumps 32 is respectively arranged on the conduction plugs 28, and the IC chip 24 is arranged on the second conduction bumps 32, whereby the IC chip 24 is electrically connected with the conduction areas and the TVS chip 26 through the first and second conduction bumps 30 and 32 and the conduction plugs 28. The first conduction bumps 30 and the second conduction bumps 32 comprise Pb or Sn, and the conduction plugs 28 comprise Cu. In addition, one conduction plug 28 is connected with a high-voltage pin VDD, another conduction plug 28 is connected with a low-voltage terminal VSS, and the other conduction plugs 28 are connected with I/O pins.

Figure 5:
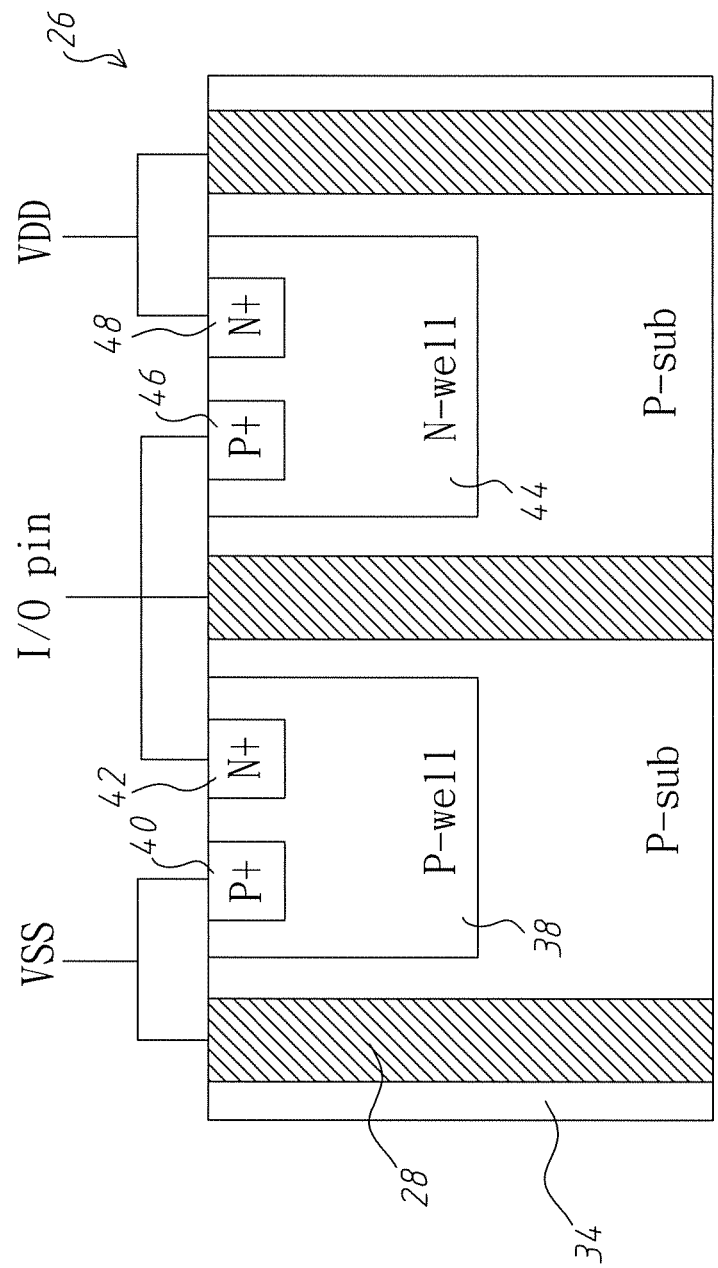
FIG. 5 is a diagram showing a TVS chip according to the first embodiment of the present invention.

The TVS chip 26, for example, but not limited to the structure of FIG. 5, can be adopted. Refer to FIG. 5. The TVS chip 26 further comprises a P-type semiconductor substrate 34, and the conduction plugs 28 are arranged in the P-type semiconductor substrate 34. A P-type well is arranged in the P-type semiconductor substrate 34 and has a first P-type heavily-doped area 40 and a first N-type heavily-doped area 42. An N-type well 44 is arranged in the P-type semiconductor substrate 34 and has a second P-type heavily-doped area 46 and a second N-type heavily-doped area 48. The conduction plugs 28, the P-type well 38 and the N-type well 44 are independent to each other. One conduction plug 28 is connected with a high-voltage pin VDD, another conduction plug 28 is connected with a low-voltage terminal VSS, and the other conduction plugs 28 are connected with I/O pins.

Figure 6:
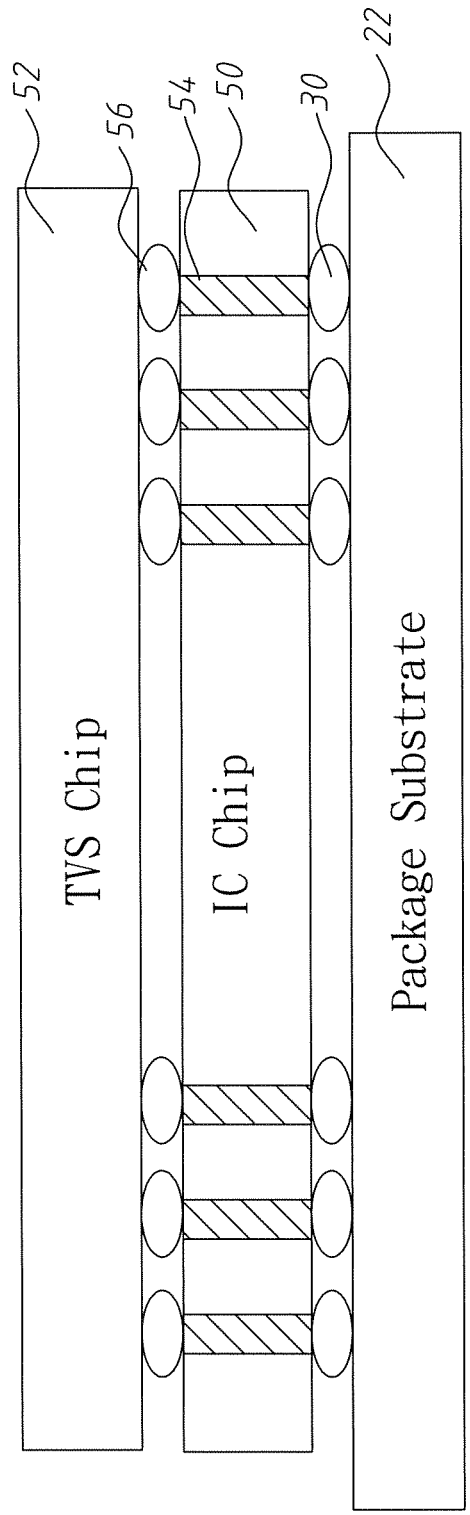
FIG. 6 is a diagram showing a 3D IC package according to the second embodiment of the present invention.
Figure 7:
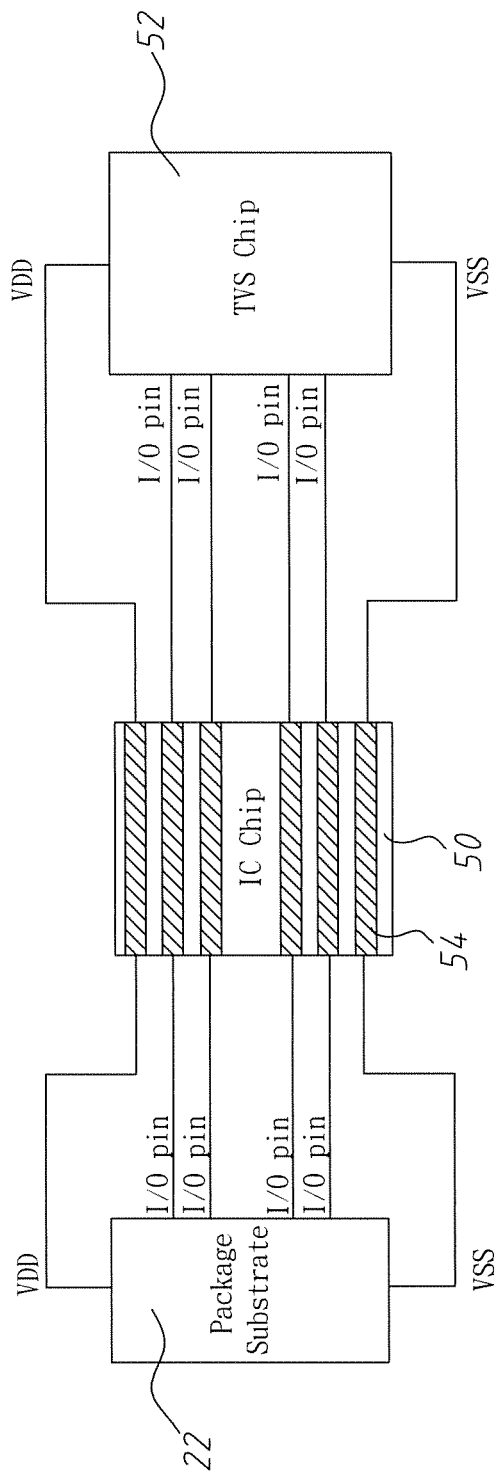
FIG. 7 is a schematic diagram showing the 3D IC package electrically connected with VDD, VSS and I/O pins according to the second embodiment of the present invention.

The second embodiment of the present invention is introduced as below. Refer to FIG. 6 and FIG. 7. The second embodiment comprises a package substrate 22 having a surface. At least one IC chip 50 without suppressing transient a voltage and at least one TVS chip 52 are sequentially stacked on the surface and electrically connected with each other. The IC chip 50 is independent from the TVS chip 52. The TVS chip 52 only has ESD function without including a memory, an analog circuit, a digital circuit and/or a RF circuit. In the second embodiment, take one IC chip 50 and one TVS chip 52 for example. A plurality of conduction plugs 54, such as through-silicon-via devices, is arranged in the IC chip 50. A plurality of the first conduction bumps 30 is arranged on conduction areas of the surface of the package substrate 22 and respectively arranged under the conduction plugs 54, whereby the IC chip 50 is electrically connected with the conduction areas through the first conduction bumps 30 and the conduction plugs 54. A plurality of the second conduction bumps 56 is respectively arranged on the conduction plugs 54, and the IC chip 52 is arranged on the second conduction bumps 56, whereby the TVS chip 52 is electrically connected with the conduction areas and the IC chip 50 through the first and second conduction bumps 30 and 56 and the conduction plugs 54. The first conduction bumps 30 and the second conduction bumps 56 comprise Pb or Sn, and the conduction plugs 54 comprise Cu. In addition, one conduction plug 54 is connected with a high-voltage pin VDD, another conduction plug 54 is connected with a low-voltage terminal VSS, and the other conduction plugs 54 are connected with I/O pins.

Since the TVS chip is independent from the IC chip without an ESD protection design, the electrical characteristics of TVS can be easily adjusted, which reduces the fabrication cost. In addition, by the conduction plugs, the TVS chip and the IC chip are electrically connected lest bond wire inductances be formed.

Figure 8:
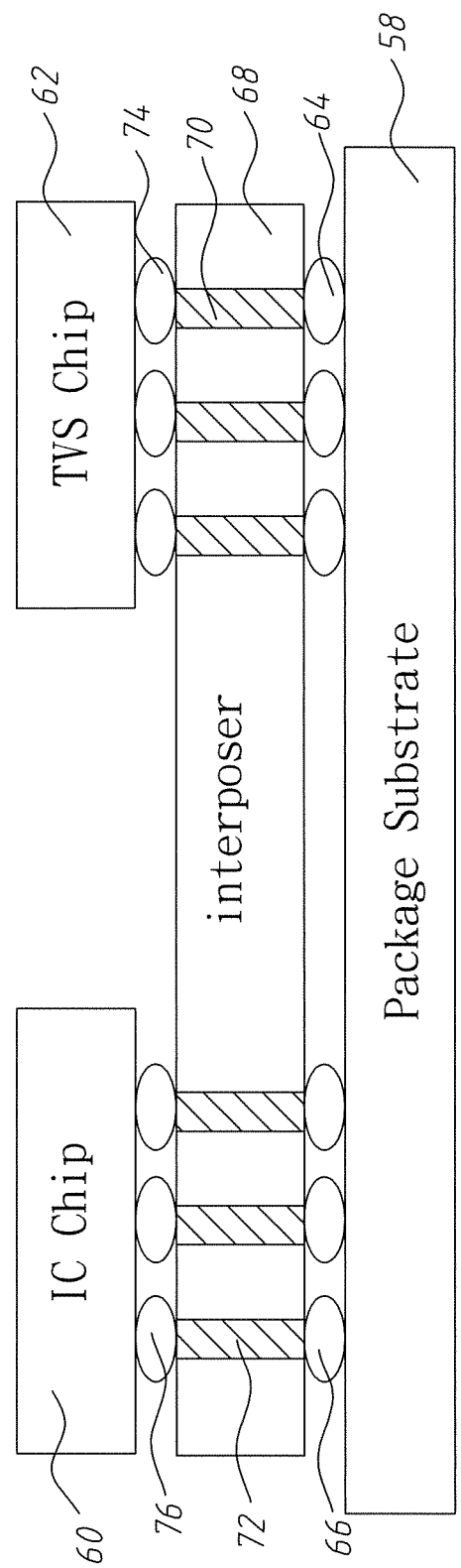
FIG. 8 is a diagram showing a 3D IC package according to the third embodiment of the present invention.
Figure 9:
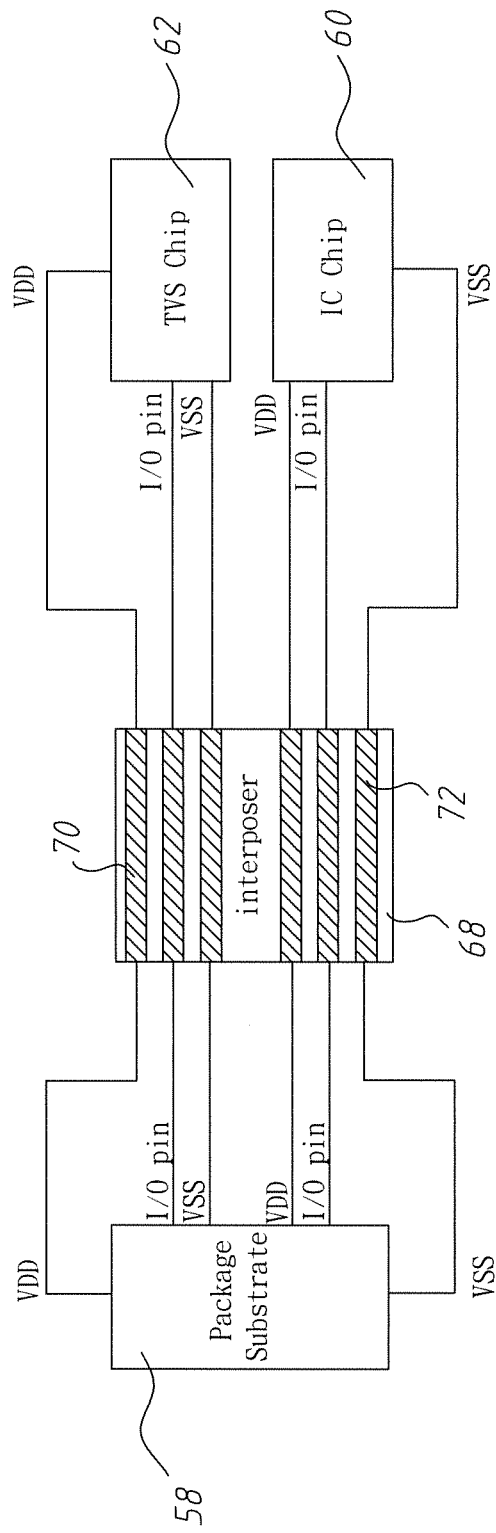
FIG. 9 is a schematic diagram showing the 3D IC package electrically connected with VDD, VSS and I/O pins according to the third embodiment of the present invention.

Based on the same advantages, the third embodiment of the present invention is introduced as below. Refer to FIG. 8 and FIG. 9. The third embodiment comprises a package substrate 58 having a surface. At least one IC chip 60 without suppressing transient a voltage and at least one TVS chip 62 are arranged on the surface and electrically connected with each other. The IC chip 60 is independent from the TVS chip 62. The TVS chip 62 only has ESD function without including a memory, an analog circuit, a digital circuit and/or a RF circuit. In the third embodiment, take one IC chip 60 and one TVS chip 62 for example. A plurality of first conduction bumps 64 and a plurality of second conduction bumps 66 are arranged on conduction areas of the surface of the package substrate 58. The first conduction bumps 64 cluster together and the second conduction bumps 66 cluster together. An interposer 68 having a plurality of first conduction plugs 70 and a plurality of second conduction plugs 72 is arranged on the first and second conduction bumps 64 and 66. The first conduction plugs 70 and the second conduction plugs 72 can be exemplified by through-silicon-via devices. The first conduction plugs 70 are respectively arranged on the first conduction bumps 64, and the second conduction plugs 72 are respectively arranged on the second conduction bumps 66. A plurality of third conduction bumps 74 is respectively arranged on the first conduction plugs 70, and the TVS chip 62 is arranged on the third conduction bumps 74. A plurality of fourth conduction bumps 76 is respectively arranged on the second conduction plugs 72, and the IC chip 60 is arranged on the fourth conduction bumps 76. The IC chip 60 is electrically connected with the TVS chip 62 through the conduction areas, the first and second conduction plugs 70 and 72, the first, second, third and fourth conduction bumps 64, 66, 74 and 76, wherein the first, second, third and fourth conduction bumps 64, 66, 74 and 76 comprise Pb or Sn, and the first and second conduction plugs 70 and 72 comprise Cu. Besides, one first conduction plug 70 is connected with a high-voltage pin VDD, another first conduction plug 70 is connected with a low-voltage terminal VSS, and the other first conduction plugs 70 are connected with I/O pins. One second conduction plug 72 is connected with a high-voltage pin VDD, another second conduction plug 72 is connected with a low-voltage terminal VSS, and the other second conduction plugs 72 are connected with I/O pins.

In conclusion, the present invention can use different process to fabricate the IC chip and the TVS chip to reduce the fabrication cost. Additionally, the present invention can also solve the problem forming parasitical inductances.

The embodiments described above are only to exemplify the present invention but not to limit the scope of the present invention. Therefore, any equivalent modification or variation according to the shapes, structures, features, or spirit disclosed by the present invention is to be also included within the scope of the present invention.

What is claimed is:

1. A three-dimension (3D) integrated circuit (IC) package comprising:

a package substrate having a surface, and at least one integrated circuit (IC) chip and at least one transient voltage suppressor (TVS) chip are arranged on said surface and electrically connected with each other, and said IC chip is independent from said TVS chip;

a plurality of conduction plugs arranged in said TVS chip;

a plurality of first conduction bumps arranged on conduction areas of said surface and respectively arranged under said conduction plugs, and said TVS chip is electrically connected with said conduction areas through said first conduction bumps and said conduction plugs; and a plurality of second conduction bumps respectively arranged on said conduction plugs, and said IC chip is electrically connected with said conduction areas and said TVS chip through said first and second conduction bumps and said conduction plugs, and said TVS chip further comprises:

a P-type semiconductor substrate, and said conduction plugs are arranged in said P-type semiconductor substrate;

a P-type well arranged in said P-type semiconductor substrate and having a first P-type heavily-doped area and a first N-type heavily-doped area; and an N-type well arranged in said P-type semiconductor substrate and having a second P-type heavily-doped area and a second N-type heavily-doped area, and said conduction plugs, said P-type well and said N-type well are independent to each other.

2. The 3D IC package according to claim 1, wherein said first conduction bumps and said second conduction bumps comprise Pb or Sn, and said conduction plugs comprise Cu.

3. The 3D IC package according to claim 1, wherein one conduction plug is connected with a high-voltage pin, another said conduction plug is connected with a low-voltage terminal, and other said conduction plugs are connected with I/O pins.

* * * * *